United States Patent
Washburn et al.

[11] Patent Number: 6,160,397
[45] Date of Patent: Dec. 12, 2000

[54] FAST SPIN ECHO PRESCAN FOR MAGNETIC RESONANCE IMAGING SYSTEMS

[75] Inventors: Sheila S. Washburn, New Berlin; Richard Scott Hinks, Waukesha, both of Wis.

[73] Assignee: General Electric Company, Milwaukee, Wis.

[21] Appl. No.: 09/223,527

[22] Filed: Dec. 30, 1998

[51] Int. Cl.[7] .................................................. G01V 3/00
[52] U.S. Cl. .......................... 324/309; 324/307; 600/459
[58] Field of Search .................................. 324/309, 307, 324/314; 600/410, 412, 459

[56] References Cited

U.S. PATENT DOCUMENTS

| | | | |
|---|---|---|---|
| 5,378,985 | 1/1995 | Hinks | 324/309 |
| 6,011,392 | 1/2000 | Zhou et al. | 324/309 |

Primary Examiner—Jay Patidar
Assistant Examiner—Brij B. Shrivastav
Attorney, Agent, or Firm—Fletcher, Yoder; Christian G. Cabou; Phyllis Y. Price

[57] ABSTRACT

Correcting gradients for a phase encoding axis in an MRI imaging system are provided in an FSE pulse sequence to correct phase errors in echo signals, such as due to effects of cross term eddy currents induced by slice select gradients. Correcting gradients to be applied to the logical phase encoding axis are identified in a prescan sequence. An initial correcting gradient is identified for correcting phase errors resulting from an initial slice select gradient pulse. Subsequent, bipolar gradient pulses for the phase encoding axis are then derived from the initial correcting gradient. The prescan technique may be used in conjunction with other prescanning sequences used to determine additional corrections for the FSE sequence. The correcting gradients reduce or eliminate image artifacts resulting from such factors as cross term eddy currents in oblique scans. An averaging sequence may be implemented to reduce the likelihood for influencing the compensation pulse calculation errors. When implemented, the logical axes may be rotated to provide any desired oblique orientation.

25 Claims, 3 Drawing Sheets

FAST SPIN ECHO PRESCAN FOR MAGNETIC RESONANCE IMAGING SYSTEMS

FIELD OF THE INVENTION

The present invention relates generally to the field of magnetic resonance imaging systems, such as those used for medical imaging. More particularly, the invention relates to an improved fast spin echo prescan designed to reduce the occurrence of artifacts in resulting reconstructed images.

BACKGROUND OF THE INVENTION

Magnetic resonance imaging (MRI) systems have been developed for acquiring and reconstructing useful images of subjects such as human patients. In medical diagnostic imaging of the human body, MRI systems are employed in various manners depending upon the particular anatomy, tissue structures, and characteristics to be reproduced in the reconstructed image. Improvements in MRI methodologies and protocols have permitted great improvements in image quality and have overcome such difficulties as long acquisition times during which a patient or tissues within the patient may move, resulting in unwanted image artifacts. One such technique is generally known as Fast Spin Echo (FSE) scanning.

In all MRI systems, a uniform magnetic field, commonly referred to as a polarizing field $B_0$, is produced. Molecules of a subject positioned within the field attempt to align with the polarizing field and precess at their characteristic frequencies, referred to as Larmor frequencies. A magnetic excitation field $B_1$ near a Larmor frequency of interest, is then applied to the material to produce a net magnetic moment $M_z$. This moment may be rotated into a plane transverse to the polarizing field to produce a net transverse magnetic moment $M_t$. After removal of the excitation field, a magnetic resonance signal is emitted by the material. This signal is then detected and processed to render the desired image.

In addition to the polarizing and excitation fields, gradient fields are typically employed to select a desired slice through the subject and to encode the signals emitted in response to the excitation field. Three orthogonal logical axis are generally defined, including a $G_z$ slice select gradient axis, a $G_y$ phase encoding gradient axes, and a $G_x$ readout gradient axis. The gradient fields produced along the gradient axes result from electrical pulses applied to gradient field coils surrounding the subject. In accordance with various localization techniques, gradients produced on the logical axes result in encoding of emitted signals from the gyromagnetic material within the subject which can be processed, such as through Fourier transformation, to determine the position of individual volume elements, or voxels, within the selected slice of the subject. The signals corresponding to each voxel can then be processed to produce data for corresponding picture elements, or pixels, in a reconstructed digital image.

While rapid signal acquisition sequences are often desirable, such as to avoid image blurring and artifacts caused by movement of the patient, for example, they have been found to result in other types of artifacts. For example, the extremely rapid transitions in gradient fields employed in FSE techniques can give rise to eddy currents producing perturbing magnetic fields. Such eddy currents may be difficult to foresee, and are believed to be linked to such factors as the physical and electromagnetic characteristics of the scanner hardware and support structures. Moreover, because in many scanning sequences, the physical axes of the magnetic fields produced by the gradient coils are rotated to orient the desired slice and to encode tissues within the slice, more complex interplay between eddy currents of the scanner structure may occur which are even more difficult to foresee and compensate.

Techniques have been developed to at least partially measure and compensate for phase errors in FSE imaging sequences (as, for example, from eddy currents). In one known approach, described in U.S. Pat. No. 5,378,985, issued on Jan. 3, 1995 to Hinks, a prescan is performed to determine appropriate compensation levels for certain parameters of a fast spin echo imaging pulse sequence. While such techniques improve image quality significantly, there is still a need for further improvement in FSE imaging sequences, particularly for phase errors that occur in the phase encoding direction.

SUMMARY OF THE INVENTION

The present invention provides an improved fast spin echo technique designed to respond to this need. The technique is particularly well suited to reduction of image artifacts resulting from phase errors in the phase encoding direction. These phase errors may, for example, result from eddy current cross terms, i.e., eddy currents on a given axis that result from gradient pulses on a different axis. In accordance with the technique, gradient compensation pulses are produced on the logical phase encoding axis during the FSE scan to compensate for phase errors resulting from eddy current effects of gradients on a logical slice select axis. The appropriate gradient area for the compensation pulses may be determined through a prescan procedure. Thereafter, for the same slice of interest, the compensation pulses are applied during the actual FSE signal acquisition sequence, compensating for the phase errors and reducing or eliminating the resulting artifacts. The technique may be used in conjunction with other prescan sequences to determine additional compensation factors to be used in the FSE data acquisition sequence.

DETAILED DESCRIPTION OF THE INVENTION

Figure 1:
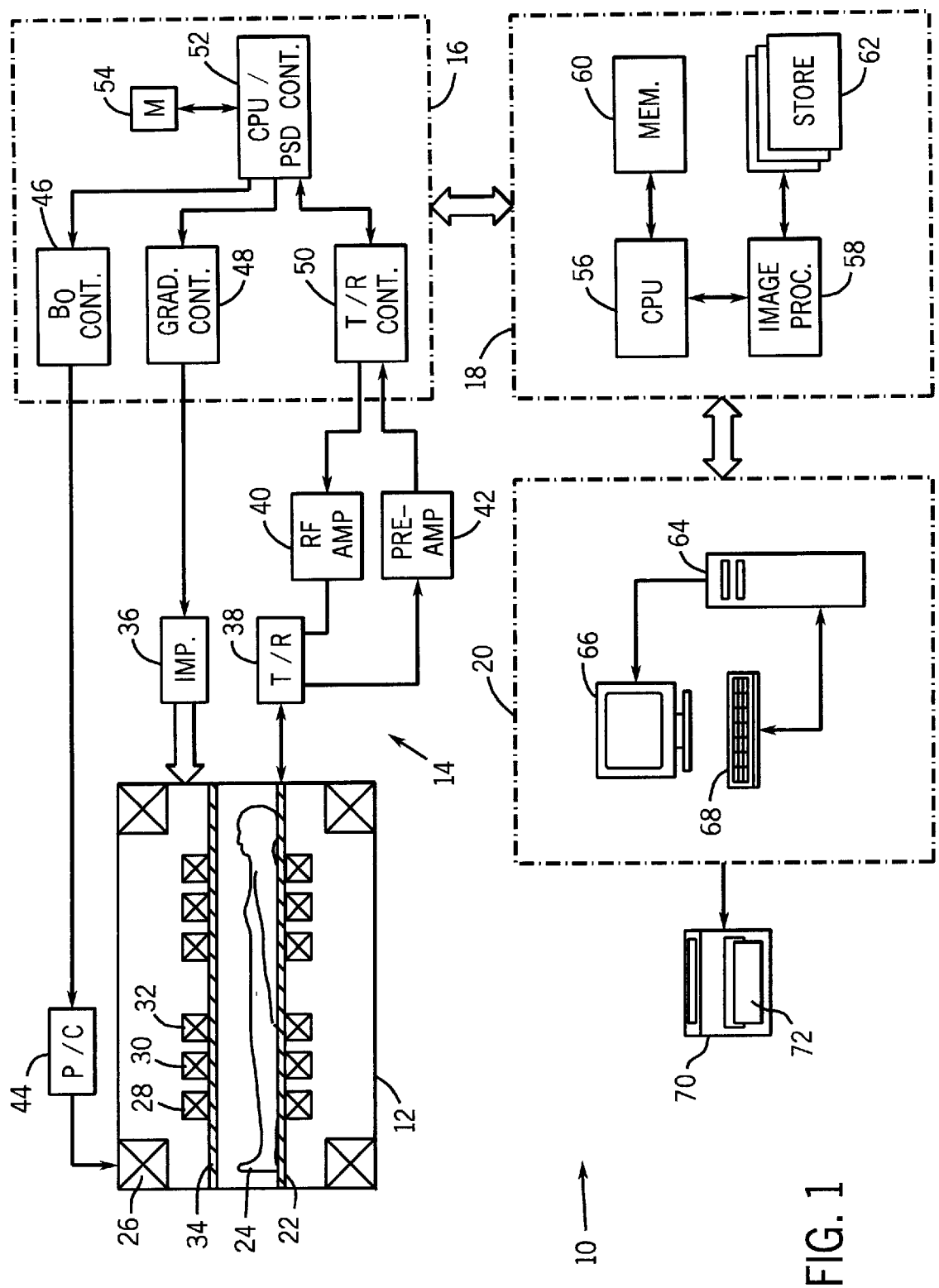
FIG. 1 is a diagrammatical representation of an MRI system in which the present technique may be employed.

Turning now to the drawings, and referring first to FIG. 1, a magnetic resonance imaging (MRI) system 10 is illustrated as including a scanner 12, interface circuitry 14, a scanner controller 16, a system controller 18, and an operator station 20. These primary functional components of MRI system 10 are interlinked to produce controlled magnetic fields and to acquire signals from gyromagnetic material in a subject of interest, which can be processed and reconstructed to form a useful image. In particular, scanner 12 includes a table 22 on which the subject 24 may be placed. The table may be extended from and retracted into the scanner to place the subject in a desired position.

Scanner 12 includes a series of coils for producing and detecting the desired signals. A polarizing magnet 26 is provided for generating a primary or polarizing field $B_0$ along an axis of scanner. A series of gradient coils 28, 30 and 32 are provided for generating controlled magnetic fields at three mutually orthogonal orientations, denoted generally as gradient fields $G_x$, $G_y$ and $G_z$. As will be appreciated by those skilled in the art, these fields may correspond to logical axes having similar notations and comprising a logical readout axis, a logical phase encoding axis, and a logical slice select axis, respectively. As will also be appreciated by those skilled in the art, the physical orientation of these logical axes may be rotated in a variety of orientations by appropriate alteration of the axis pulses during preparation, excitation, and readout sequences to produce images of variously oriented slices. A radio frequency (RF) coil 34 generates a transverse magnetic field resulting in emissions from gyromagnetic material within the subject during acquisition sequences. In the illustrated embodiment, RF coil 34 also serves as a receiving coil for detecting emissions from the gyromagnetic material. Alternatively, a separate receiving coil, or a plurality of receiving coils may be provided for receiving such signals, particularly from desired regions of the subject's anatomy.

The coils of scanner 12 are controlled by interface circuitry 14. Circuitry 14 includes an amplifier 36 which, in practice, includes several amplification circuits for driving gradient coils 28, 30 and 32. A transmit/receive switch 38 is coupled to RF coil 34 and may be switched between active and passive modes to generate RF excitation pulses and to receive emissions from the gyromagnetic material within the subject. Transmit/receive switch 38 is, in turn, coupled to an RF amplifier 40 and to a preamplifier 42. In operation, RF amplifier 40 is electrically coupled to the RF coil through transmit/receive switch 38 during a transmit mode of operation to pulse the coil as desired and as defined by a pulse sequence description implemented in a particular examination. Preamplifier 42 is then electrically coupled to RF coil 34 through transmit/receive switch 38 during receive modes of operation to amplify signals detected by the coil. A power supply/controller 44 is coupled to polarizing magnet 26 to create a highly uniform magnetic field during operation.

The components of interface circuitry 14 are coupled to functional components within scanner controller 16. Thus, power supply/controller 44 is coupled to a polarizing field control module 46 which regulates operation of the polarizing magnet. A gradient coil controller 48 is coupled to amplifier 36 and outputs digitized pulses to the gradient coils in accordance with examination pulse sequence descriptions. Transmit/receive controller 50 is coupled to the RF coil 34 through the intermediary of switch 38, amplifier 40, and preamplifier 42 to regulate production of RF excitation pulses, as well as the reception and processing of detected signals. Modules 46, 48 and 50 are, in turn, coupled to a CPU/pulse sequence description controller 52. Controller 52 receives pulse sequence descriptions from system controller 18 and implements examination pulse sequences. Controller 52 is coupled to memory circuitry 54 which may be used to store pulse sequence descriptions, configuration parameters, calibration parameters, and so forth.

Data for execution of examination sequences and data resulting from such sequences is exchanged between scanner controller 16 and system controller 18. System controller 18 includes a CPU 56 for regulating operation of MRI system 10. CPU 56 is coupled to image processing circuitry 58 for processing signals received and amplified during examination sequences, and for producing digitized data from the received signals which can be used to reconstruct useful images of the subject anatomy. CPU 56 is also coupled to a memory circuit 60 which may be employed to store pulse sequence descriptions, examination protocols, calibration data, image data, and so forth. Moreover, system controller 18 may include one or more data storage devices 62, such as in the form of disc or tape memory devices.

Operator station 20 permits an operator to command desired examination sequences, to configure system 10, and to review system configurations and acquired data and images. Thus, operator station 20 typically includes a computer workstation 64 coupled to a conventional monitor 66, and one or more input devices, such as a keyboard 68. Operator station 20 exchanges data with the system through the intermediary of system controller 18. The operator station may be coupled to one or more output devices 70 for producing a hard copy 72 of reconstructed images acquired through the functional circuitry described above.

The MRI system 10 described above may be used to implement a variety of pulse sequences for acquiring useful image data in accordance with many different techniques. In a preferred embodiment, a fast spin echo (FSE) technique is employed for producing image data. As will be recognized by those skilled in the art, in one such technique RF refocused echoes are generated through the implementation of a Carr-Purcell-Meiboom-Gill (CPMG) sequence in which an echo train encodes multiple views within a single echo train "shot." In a particularly preferred technique, a 2DFT Rapid Acquisition Relaxation Enhanced (RARE) sequence is employed in which 16 MR echo signals are acquired as a result of a 90° RF excitation pulse generated in the presence of a $G_z$ slice select gradient pulse. The transverse magnetization provided by the RF pulse is refocused by a series of 180° RF echo pulses to produce MR spin echo signals that are acquired in the presence of $G_x$ readout gradient pulses. Each MR spin echo signal is separately phase encoded by respective $G_y$ phase encoding pulses. The phase encoding pulses vary through the scan sequence to provide separate views. Through subsequent Fourier transformation, acquired signals resulting from the echoes are processed to generate image data which may be used to reconstruct a useful image of the subject anatomy.

It has been found that certain image artifacts may occur in FSE imaging techniques due to system imperfections such as eddy currents. Such artifacts can degrade the resulting reconstructed image quality. For example, eddy current cross terms have been detected in some scan sequences. These cross terms cause phase errors in the logical phase encoding axis $G_y$ when gradient pulses are applied to the logical slice selection axis $G_z$.

Figure 2:
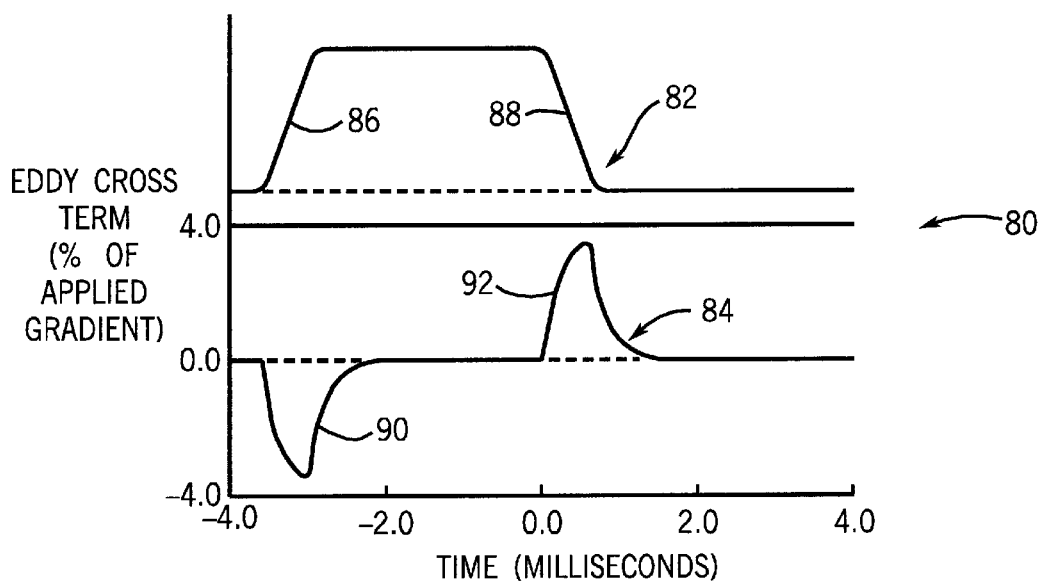
FIG. 2 is a graphical representation of exemplary cross-term eddy currents produced between axes of the system illustrated in FIG. 1.

FIG. 2 illustrates exemplary measured eddy currents in such conditions. As illustrated graphically in FIG. 2, eddy currents between the axes are produced upon each rise and fall of the gradient pulse to produce corresponding gradient and eddy current curves 80. In the example illustrated in FIG. 2, a severe cross term was observed. In particular, the rise 86 of the applied gradient corresponded to a negative-going eddy current pulse 90, while the descending portion of the applied gradient 88 resulted in a positive-going eddy current pulse 92. In this example, the time constant of the eddy current pulse was relatively short (e.g. 200 microseconds) and of large amplitude (e.g. 4%), resulting in large phase errors in an FSE imaging sequence.

Figure 3:
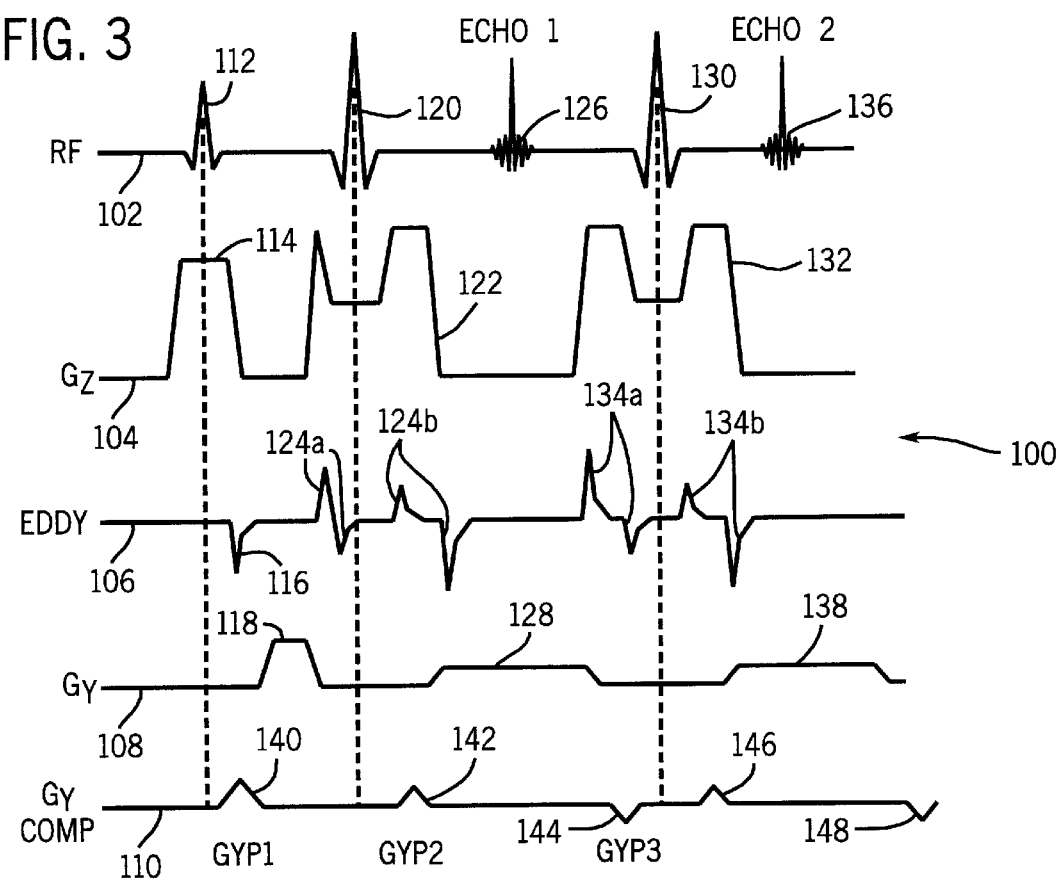
FIG. 3 is a graphical representation of an exemplary FSE pulse sequence modified for measurement of phase errors in the phase encoding axis including compensation pulses for correction of eddy currents in accordance with the present technique.

The present technique of compensating phase errors permits compensation for such eddy current cross terms, thereby reducing the occurrence of artifacts in resulting image data. FIG. 3 illustrates an FSE pulse sequence that has been modified to measure phase errors and apply compensation gradients on the logical phase encoding gradient axis $G_y$ in accordance with the present technique to compensate for phase errors due to such factors as cross term eddy currents. The resulting pulse sequence, indicated generally by the reference numeral 100, may be represented as pulses on a series of axes, including an RF axis 102, a slice select axis $G_z$ 104, a resulting eddy current cross term axis 106, a phase encoding gradient axis $G_y$ 108, and a compensation gradient axis 110. As illustrated, axis $G_y$ (calibration) 108 and $G_y$ (compensation) 110 represent the same physical axis. The readout gradient axis $G_x$ is set to zero during measurement of phase errors on $G_y$ and is not represented in FIG. 3. As is well known in the art, a conventional FSE imaging pulse sequence does not include the $G_y$ calibration or compensation gradients 108 and 110 but rather includes phase encoding pulses on the logical $G_y$ axis prior to and following each echo signal. Further, such conventional FSE imaging pulse sequences also include readout gradient pulses on the logical $G_x$ axis during acquisition of each echo signal.

In the pulse sequence 100 of FIG. 3, a 90° RF excitation pulse 112 is generated on axis 102 via RF coil 34 (see FIG. 1). At the same time, a slice select gradient pulse 114 is produced on the $G_z$ axis. It has been found that gradient pulses played on the logical slice selection $G_z$ or readout $G_x$ axes can result in cross term eddy currents that appear as phase errors and image artifacts on the logical phase encoding axis $G_y$. In accordance with the requirements of the FSE pulse sequence, any phase shift that occurs between the 90° RF excitation pulse 112 and the first 180° RF refocusing pulse 120 must be balanced by exactly twice the phase shift occurring between each pair of 180° refocusing pulses, such as first 180° RF pulse 120 and second 180° RF pulse 130. This so-called "CPMG condition" is necessary to maintain correct NMR signal components in the plurality of echoes acquired during FSE pulse sequences. In the exemplary pulse sequence, phase shifts result from eddy currents 116 and 124a occurring prior to 180° refocusing pulse 120. To maintain the CPMG condition, the combined phase shifts from eddy currents 124b and 134a occurring between 180° refocusing pulses 120 and 130 must be twice the value of the prior phase shifts. Deviation from this 1:2 proportional relationship represents phase errors that violate the CPMG condition and can cause image artifacts.

As illustrated in FIG. 3, in accordance with the present technique phase errors, such as those resulting from cross term eddy currents, are compensated by pulses on the logical phase encoding gradient axis $G_y$. In particular, compensation pulse 140 is adjusted during a calibration prescan to produce a phase shift that is equal to a measured phase error but opposite in sign, thereby canceling its effect. This compensation pulse 140 ensures that phase errors in the logical $G_y$ axis are compensated in order to maintain the CPMG condition. Pulse 140 determined during the prescan measurement is then applied in subsequent image acquisition measurement cycles.

It has been found that compensation pulse 140 is primarily responsible for maintaining the CPMG condition for phase shifts on logical phase encoding axis $G_y$. As further illustrated in FIG. 3, when the CPMG condition is fully maintained, additional phase shifts such as those generated by eddy currents 124b may be present during acquisition of echo signal 126 even though they may be substantially canceled by eddy currents 134a subsequent to echo signal 126 and prior to RF pulse 130. These phase shifts generally have less severe consequences on FSE imaging than those compensated by compensation pulse 140. However, in some cases they introduce undesired phase shifts into the image and may also have detrimental effects on subsequent prescan calibration measurements such as those described in U.S. Pat. No. 5,378,985, issued on Jan. 3, 1995 to Hinks. In accordance with the present method, phase errors affecting echo signal 126 are compensated by additional compensation pulse 142 on the logical phase encoding axis $G_y$. To maintain the CPMG condition, additional compensation pulse 144 is introduced after the echo signal 126 and prior to RF pulse 130 to unwind the phase shift introduced by compensation pulse 142. Subsequent eddy currents are compensated by pairs of correction pulses 146 and 148, and so forth, positioned about each echo signal. In the illustrated embodiment, each pair of correction pulses 142, 144 and 146, 148 represents a bi-polar pair that affects the echo phase but rewinds the phase prior to the next RF pulse so that it has no effect on the CPMG phase condition. Alternatively, in another embodiment, compensation pulse 144 may be larger or smaller than compensation pulse 142 in order to add an additional phase shift necessary to cancel further phase errors detected between refocusing RF pulses 120 and 130. Similarly unbalanced correction pulses 146 and 148 and so forth may be used to correct further phase errors. Preferred methods for determining the parameters of the compensation pulses are described in greater detail below.

Figure 4:
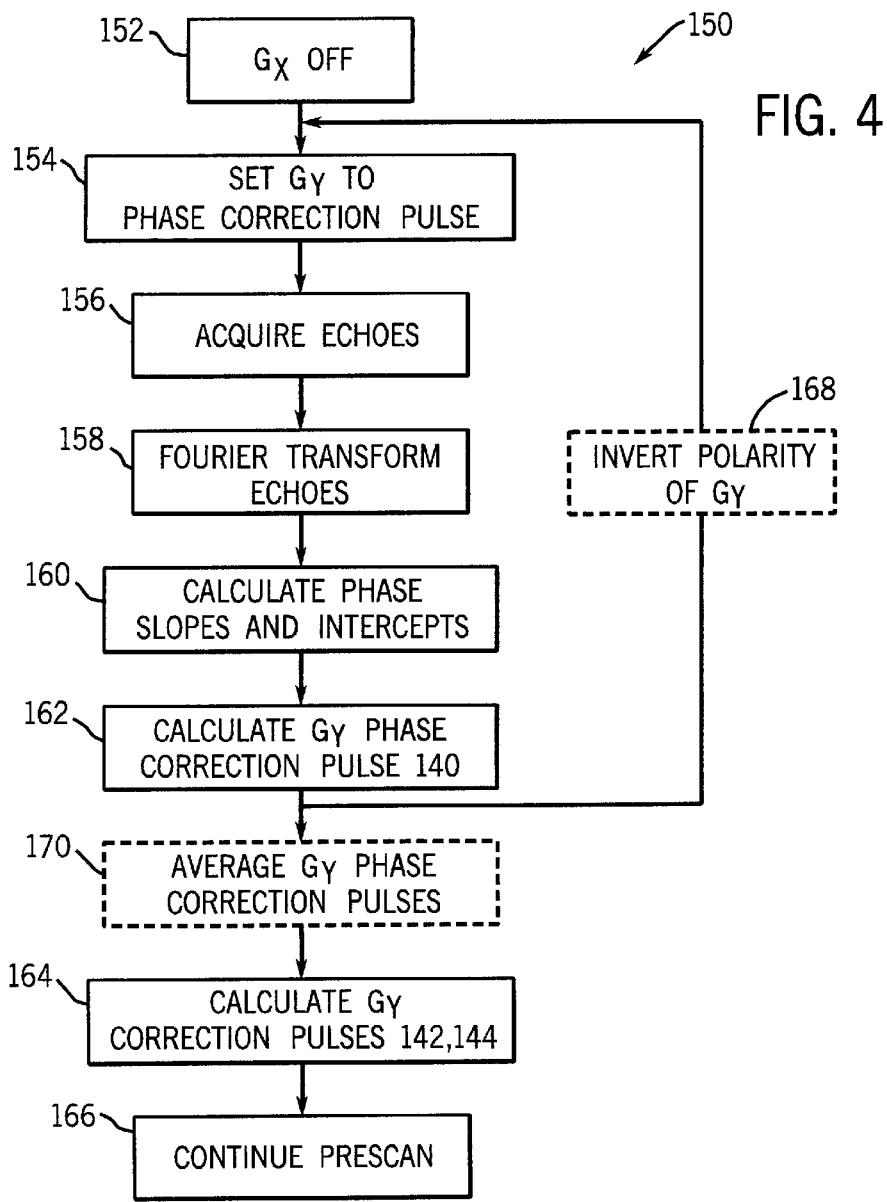
FIG. 4 is a flow chart representing exemplary control logic for determining proper compensating gradient pulse characteristics for use in the pulse sequence of FIG. 3.
Figure 5:
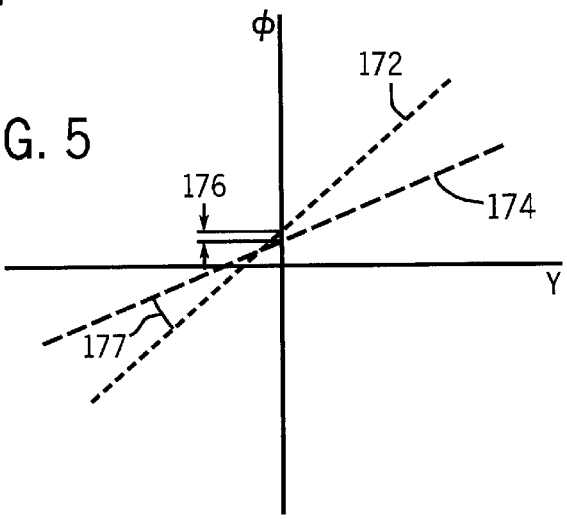
FIG. 5 is a graphical representation of phase profiles for echo signals used as a basis for computing correcting gradients in accordance with the present technique.

FIG. 4 and FIG. 5 illustrate presently preferred methods for evaluating appropriate correction or compensation pulses employed in the pulse sequence illustrated in FIG. 3. An iterative process is employed to determine the appropriate compensation parameters through a prescanning pulse sequence. Logical steps involved in this pulse sequence are summarized in the flow chart of FIG. 4. It should be noted that the iterative steps indicated in FIG. 4 may be coupled with other prescanning techniques, such as techniques for adjusting phases of RF excitation pulses and RF refocusing pulses.

Referring to FIG. 4, logical steps in the prescan process, indicated generally by reference numeral 150, begin at step 152 where any pulses on a logical readout axis $G_x$ are turned off before the FSE prescan sequence is performed. In place of conventional phase encoding pulses, a series of readout-like gradient pulses 108 are played on the logical phase encoding axis $G_y$. At step 154 a compensation pulse 140 is generated on the logical phase encoding axis $G_y$, as described below. However, in the first iteration, step 154 is not performed due to the need to calculate a candidate correction gradient. At step 156 the first two echo signals are acquired. At step 158, the two echo signals are Fourier transformed to provide I and Q signal values representing a projection of the object under investigation in the logical phase encoding axis $G_y$. These signal values are then used at step 160 to compute phase slopes and intercepts in accordance with the relationship:

$$\phi = \operatorname{atan2}(I/Q) \qquad\qquad (\text{eq. 1});$$

where $\phi$ is the phase angle of signal along the logical phase encoding axis and atan2 represents that arctangent function.

FIG. 5 graphically illustrates exemplary phase profiles for the first and second echo signals following such transformation, and based upon calculations in accordance with equation 1. The phase profiles, denoted 172 and 174, may have φ-axis intercepts offset from one another by a phase difference 176, and may be angularly offset from one another by phase slope difference 177. In accordance with known methods, if the phase intercept difference 176 is greater than a desired amount, such as 0.5° or 1°, a correcting RF pulse phase shift is calculated and applied on successive iterations.

In accordance with the present technique, if the phase slope difference 177 is greater than a desired amount, such as 0.5%FOV or 1%FOV, a correcting gradient pulse 140 is calculate as indicated at step 162 in FIG. 4. On the other hand, if the phase difference is within the desired tolerance band, no correcting gradient is used, and the prescan sequence may proceed as indicated at step 166.

Where a logical phase encoding axis correcting gradient is determined to be desired based upon the phase slope difference, a gradient area representing one-half of the phase slope difference 177 is calculated at step 162 for the subsequent iterative sequence. In a present embodiment, this correction gradient 140 is calculated in accordance with the relationship:

$$G_{Ycorr} = \frac{(slope[echo1] - slope[echo2]) * RES * 10^6}{2.0 * \pi * GAM * FOV}; \quad \text{(eq. 2)}$$

where $G_{Ycorr}$ (in microsecond-gauss/cm) is the area of the candidate correcting gradient on the logical $G_y$ axis (140 in FIG. 3), slope[echo1] and slope[echo2] are the phase slopes (radians/point) of the first and second echo signals, respectively following Fourier transformation (see FIG. 5), RES is the resolution (number of points) in the echo signal, GAM is the gyromagnetic ratio for hydrogen, and FOV is the field of view in centimeters in the $G_y$ encoding direction (108 in FIG. 3). Following this calculation in step 162, the computed gradient is applied at step 154 in the subsequent iterative sequence in which the FSE prescan pulse sequence is repeated. The iterative process continues with equation 2 being used at step 160 to calculate a change in the gradient area which is added to the previous candidate correction gradient to further reduce the phase difference between the echo signals. In the present embodiment, two iterative passes are made to compute the desired logical $G_y$ axis correction gradient 140. Alternatively, additional passes may be executed to drive the phase slope difference to a desired range.

As noted above, the foregoing process generates a logical $G_y$ axis gradient correction pulse 140 which corrects for phase errors, thereby correcting errors in the CPMG condition. However, the initial correcting gradient 140 does not correct additional phase shifts that may be introduced into the echo signals between pairs of RF refocusing pulses 120, 130, and so forth. Eddy current cross terms resulting from gradient transitions on the slice selection gradient can cause such phase shifts, as shown for the eddy current term 106 in FIG. 3. These phase errors can be compensated by additional compensation pulses (142, 144, 146, and 148 in FIG. 3).

In one embodiment these compensation pulses are calculated to be bipolar pulse pairs with amplitudes determined to make the absolute phase slope for each echo signal (172 and 174 in FIG. 5) zero. In accordance with this embodiment correction gradient amplitudes may be calculated for each echo signal or may be calculated for a subset of the total number of echo signals and then applied to compensating gradient pulses in each echo interval.

In a preferred embodiment the phase errors that affect the echo phase but no the CPMG condition are assumed to result from short time constant eddy current cross terms (106 in FIG. 3) resulting from the slice direction gradient $G_z$ (104 in FIG. 3). The phase error that is compensated by pulse 140 is equal to the difference in phase shifts caused by eddy currents 116 and 124*a*. These eddy current terms are substantially proportional to the amplitude of $G_z$ gradients 114 and 122 played during corresponding RF pulses 112 and 120, respectively. The error in phase due to these gradient transitions can be computed from the correcting gradient 140 because the errors are linearly related to amplitude due to the short time constants involved. In the present embodiment, bipolar correcting gradients are thus computed, as indicated at step 164 in FIG. 4, in accordance with the relationships:

$$G_{Ycorr2} = (1.0/(G_z scale-1.0))*G_{Ycorr} \quad \text{(eq. 3); and}$$

$$G_{ycorr3} = -1.0*G_{Ycorr2} \quad \text{(eq. 4)}$$

where $G_{Ycorr2}$ is the amplitude of a positive gradient (142, 146 in FIG. 3), $G_{Ycorr3}$ is the amplitude of a negative gradient (144, 148 in FIG. 3), $G_z$scale is a scaling factor equal to the ratio of the amplitude of the slice selection gradient during the 90° RF pulse to the amplitude of the slice selection gradient during the 180° pulse (112 and 120 in FIG. 3), and $G_{Ycorr}$ is the value of the first logical $G_y$ axis correcting gradient calculated as described above. Calculation of gradient correction factors by eq. 3 is limited to cases where Gzscale is not equal to 1.0.

Following calculation of the gradients for correcting for cross term eddy current effects, the FSE prescan sequence may continue, as indicated at step 166 in FIG. 4. As will be appreciated by those skilled in the art, subsequent prescan steps may include steps for identifying correcting pulses to be applied to other logical axes, as well as timing or phase parameters for the pulses or RF pulses applied in the pulse sequence. Following any such prescan steps, the FSE scanning sequence is executed in the conventional manner but with all previously calculated correction pulses and values in place.

In a presently preferred extension of the process described above, a second set of iterative prescan steps may be performed to reduce the potential for inadvertently compensating phase errors resulting from the logical $G_y$ axis calibration encoding gradient itself (108 in FIG. 3). In this extension of the technique, illustrated in the broken-line steps of FIG. 4, the sign of the encoding gradient 108 is reversed after the initial iterative process described above, and the process is repeated with the inversely polarized gradients, as indicated at step 168 of FIG. 4. The correcting gradient is then determined by averaging the compensation gradients determined for the positive and negative encoding gradients, as indicated at step 170. It should be noted that, while eddy currents from the encoding gradient reverse in polarity in the two iterative processing sequences, those resulting from cross terms will remain the same polarity. The additional steps thus provide for canceling of the effects of the encoding gradient itself. In this alternative process, following determination of the initial correcting gradient at step 170, the subsequent bipolar correcting gradients are computed at step 164 as described above.

What is claimed is:

1. A method for identifying compensation pulses for correcting phase errors in an MRI system, the method comprising the steps of:

generating an RF excitation pulse;

generating a gradient pulse on a logical slice select axis during the RF excitation pulse;

sensing at least first and second echo signals resulting from the excitation pulse; and generating a correcting gradient pulse on a logical phase encoding axis to compensate for phase errors on said logical phase encoding axis.

2. The method of claim 1, wherein the correcting gradient pulse is identified during a first prescan sequence in which the RF excitation pulse and the gradient pulse on the logical slice select axis are generated, and wherein the correcting gradient pulse is generated during an examination pulse sequence following the prescan sequence.

3. The method of claim 1, comprising the further steps of iteratively adjusting the correcting gradient pulse to obtain a desired level of phase difference between the first and the second echo signals or the respective Fourier transforms of the echo signals.

4. The method of claim 1, comprising the further steps of computing additional correcting gradient pulses to be generated on the logical phase encoding axis for each echo signal sensed during an examination.

5. The method of claim 4, wherein the additional correcting gradient pulses represent pairs of bipolar gradient pulses and wherein a first additional correcting gradient pulse of a first polarity is generated before at least one echo signal and a second additional correcting gradient pulse of opposite polarity is generated after the echo signal.

6. The method of claim 1, wherein the steps are performed at least once with a first measurement gradient pulse of a first polarity to determine a first correction gradient pulse, the steps are subsequently performed at least once with a second measurement gradient pulse of a second polarity to determine a second correction gradient pulse, and a desired correcting gradient is derived from the first and second correcting gradient pulses.

7. The method of claim 6, wherein the first and second correcting gradient pulses are derived during iterative prescan sequences to reduce a phase difference of echo signals or the respective Fourier transforms of the echo signals to within a desired range.

8. The method of claim 6, wherein the desired correcting gradient is an average of the first and second correcting gradient pulses.

9. A method for improving magnetic resonance images, the method comprising the steps of:
executing a fast spin echo pulse sequence wherein an RF excitation pulse is generated and thereafter a series of RF refocusing pulses, a corresponding series of gradient pulses are generated on a logical slice select axis, and magnetic field gradients are generated on a logical encoding axis to spatially encode echo signals; and
generating compensation pulses on a logical spatially encoding axis to compensate for phase errors occurring on said logical spatially encoding axis.

10. The method of claim 9, wherein a first slice select gradient is generated during the RF excitation pulse and a first compensation pulse is generated on the logical spatially encoding axis during a trailing edge portion of the first slice select gradient.

11. The method of claim 9, wherein compensation pulses are generated for each of the series of gradient pulses.

12. The method of claim 11, wherein compensation pulses generated for each of the gradient pulses corresponding to an RF refocusing pulse are generated in bipolar pairs comprising a first compensation pulse prior to a respective echo signal and a second compensation pulse subsequent to the respective echo signal.

13. The method of claim 9, comprising the further step of determining parameters of the compensation pulses in a prescan routine executed prior to the fast spin echo pulse sequence.

14. The method of claim 13, wherein the prescan routine includes iterative steps for identifying compensation pulses reducing phase differences of echo signals or the respective Fourier transforms of the echo signals.

15. The method of claim 13, wherein the prescan routine includes steps for identifying a first compensation pulse using at least one measurement gradient of a first polarity, identifying a second compensation pulse using at least one measurement gradient of a second polarity, and deriving a desired compensation pulse from the first and second pulses.

16. A magnetic resonance imaging system for producing images of a subject of interest, the system comprising:
a polarizing magnet;
an RF coil for producing an RF excitation signals and a series of RF refocusing signals;
gradient coils for selecting desired slices of the subject and for phase encoding MR signals emitted by gyromagnetic material of the selected slice; and
a control circuit for applying correcting signals to a gradient coil for a logical phase encoding axis to compensate for phase errors resulting from gradients applied via a gradient coil for a logical slice select axis.

17. The system of claim 16, wherein the RF coil produces RF signals in a first mode of operation and receives the MR signals emitted by the gyromagnetic material in a second mode of operation.

18. The system of claim 16, wherein the control circuit is configured to apply a first correcting pulse to the logical phase encoding axis coil during a first slice select gradient pulse and thereafter to apply second correcting pulses different from the first correcting pulse during subsequent slice select gradient pulses.

19. The system of claim 18, wherein the second correcting pulses are grouped in pairs of bipolar pulses.

20. The system of claim 16, wherein the control circuit is configured to execute a prescan routine prior to an MR examination sequence to identify appropriate correcting signals.

21. An MR imaging system for producing image data via a fast spin echo pulse sequence, the system comprising:
means for generating a polarizing field;
means for generating an RF excitation pulse followed by RF refocusing pulses;
means for generating gradient pulses on a logical slice select axis and on a logical phase encoding axis; and
means for controlling the means for generating gradient pulses to produce gradient pulses on the logical slice select axis for the RF excitation pulse and for each of the RF refocusing pulses and to produce gradient pulses on the logical phase encoding axis to correct for phase errors due to the gradient pulses on the logical slice select axis.

22. The system of claim 21, wherein the means for generating gradient pulses include gradient coils and an amplifier circuit coupled to the gradient coils.

23. The system of claim 21, wherein the means generating gradient pulses generates a first correcting gradient on the logical phase encoding axis for a first gradient on the logical slice select axis and a series of second correcting gradients on the logical phase encoding axis for a series of second gradients on the logical slice select axis.

24. The system of claim 23, wherein the series of second correcting gradients includes pairs of bipolar gradients generated for each echo signal resulting from the RF excitation pulse.

25. The system of claim 21, wherein the means for controlling is configured to execute a prescan routine prior to an examination sequence for determining correcting gradients to be generated on the logical phase encoding axis.

* * * * *